United States Patent [19]

Cho et al.

[11] Patent Number: 5,314,838

[45] Date of Patent: May 24, 1994

[54] METHOD FOR MAKING A SEMICONDUCTOR LASER

[75] Inventors: Alfred Y. Cho, Summit; Sung-Nee G. Chu, Murray Hill; Kuochou Tai, North Plainfield; Yeong-Her Wang, Scotch Plains, all of N.J.

[73] Assignee: AT&T Bell Laboratories, Murray Hill, N.J.

[21] Appl. No.: 943,103

[22] Filed: Sep. 10, 1992

Related U.S. Application Data

[63] Continuation of Ser. No. 628,285, Dec. 14, 1990, abandoned.

[51] Int. Cl.$^5$ ............................................. H01L 21/20
[52] U.S. Cl. .................................. 437/105; 437/107; 437/126; 437/133; 437/129; 372/43; 372/44; 372/45; 372/46
[58] Field of Search ............... 437/105, 107, 126, 129, 437/133, 946; 372/43, 44, 45, 46

[56] References Cited

U.S. PATENT DOCUMENTS

| | | | |
|---|---|---|---|
| 4,660,207 | 4/1987 | Svilans . | |
| 4,873,696 | 10/1989 | Coldren et al. . | |
| 4,994,408 | 2/1991 | Johnson | 437/133 |
| 5,027,169 | 6/1991 | Takahashi et al. | 357/4 |
| 5,034,344 | 7/1991 | Jewell et al. | 437/129 |
| 5,034,958 | 7/1991 | Kwon et al. | 372/45 |

OTHER PUBLICATIONS

Wang, Y. H. et al., "Observation of reduced current thresholds in GaAs/AlGaAs vertical-cavity surface-emitting lasers grown on 4° off-orientation (001) GaAs substrates", *Appl. Phys. Lett.* 57 (16), 1990, pp. 1613–1615.

Ogura, M. et al., "Surface-Emitting Laser Diode With Distributed Bragg Reflector and Buried Heterostructure", *Electronics Letters*, 26 (1), 1990, pp. 18–19.

Mochizuki, K. et al., "Influence of Substrate Misorientation on Surface Morphology of Be-Doped GaAs Grown by MBE", *Japanese Journal of Applied Physics*, Part 2 (Letters) 29 (7), 1990, pp. L1046–L1048.

Heiblum, M. et al., "Growth by molecular beam epitaxy and characterization of high purity GaAs and AlGaAs," *J. Appl. Phys.* 54, (12) Dec. 1983, pp. 6982–6988.

*J. Appl. Phys.* 66, 1989, "Characterization of GaAs/(GaAs)$_n$(AlAs)$_m$ Surface-Emitting Laser Structures Through Reflectivity and High-Resolution Electron Microscopy Measurements," by J. Faist, et al., pp. 1023–1032.

*Appl. Phys. Lett.* 55, 1989, "Room-Temperature Continuous-Wave Vertical-Cavity surface-Emitting GaAs Injection Lasers," by K. Tai, et al., pp. 2473–2475.

*J. Appl. Phys.* 58, 1985, "Effects of Substrate Misorientation on the Properties of (Al,Ga)As Grown by Molecular Beam Epitaxy," by Tsui, et al., pp. 2570–2572.

*Thin Solid Films* 100, 1983, "Growth of III-V Semiconductors by Molecular Beam Epitaxy and Their Properties," by A. Y. Cho, pp. 291–317.

*J. Crystal Growth* 95, 1989, "Influence of As$_4$/Ga Flux Ratio on Be Incorporation in Heavily Doped GaAs Grown by Molecular Beam Epitaxy," by Y. C. Pao and J. Franklin, pp. 301–304.

*J. Appl. Phys.* 59, 1986, "Properties of Al$_x$Ga$_{1-x}$As ($x_{Al}$ approximately 0.3) Grown by Molecular-Beam Epitaxy on Misoriented Substrates," by Tsui, et al., pp. 1508–1512.

*Appl. Phys. Lett.* 51, 1987, "Effect of Substrate Tilting on Molecular Beam Epitaxial Grown AlGaAs/GaAs Lasers Having Very Low Threshold Current Densities," by H. X. Chen, et al., pp. 2094–2096.

*Primary Examiner*—Olik Chaudhuri
*Assistant Examiner*—Ramamohan Rao Paladugu
*Attorney, Agent, or Firm*—Martin I. Finston

[57] ABSTRACT

Disclosed is a method for manufacturing a vertical cavity, surface-emitting laser. The method includes growing a distributed Bragg reflector having at least 10 layers of alternating composition on a gallium arsenide substrate. The growth surface of the substrate is tilted by an angle of 1°–7° from the orientation of a (100) surface toward the orientation of a (111)A surface. This results in improved reflectivity of the DBR.

7 Claims, 4 Drawing Sheets

200 n-Al$_{0.3}$Ga$_{0.7}$As CONFINEMENT LAYER

λ/4 REFLECTOR STACK { n-Al$_{0.1}$Ga$_{0.9}$As
n-AlAs 50 nm

210 p-GaAs ACTIVE LAYER
3-PERIOD SUPERLATTICE
n-Al$_{0.3}$Ga$_{0.7}$As CONFINEMENT LAYER

λ/4 REFLECTOR STACK { n-Al$_{0.1}$Ga$_{0.9}$As
n-AlAs 50 nm

METHOD FOR MAKING A SEMICONDUCTOR LASER

This application is a continuation of application Ser. No. 07/628,285, filed on Dec. 14, 1990, now abandoned.

FIELD OF THE INVENTION

The invention relates generally to methods of manufacturing semiconductor diode lasers, and more particularly to those methods that pertain to vertical-cavity, surface-emitting lasers (VCSELs) that include, bounding the laser cavity, at least one distributed Bragg reflector (DBR).

BACKGROUND OF THE INVENTION

Semiconductor heterojunction lasers are usefully made by processes that include the epitaxial growth of successive layers of III-V materials of varying composition on a III-V substrate, typically, a gallium arsenide or indium phosphide substrate. Such layers will herein be understood to extend horizontally, and the axis perpendicular to the layers will be understood to extend vertically. Such lasers may generally be classified into two groups, namely edge-emitting lasers and surface-emitting lasers. Edge-emitting lasers emit laser radiation in a substantially horizontal direction, whereas surface-emitting lasers emit laser radiation in a substantially vertical direction. A surface-emitting laser is said to have a vertical cavity (and is thus referred to as a vertical-cavity surface-emitting laser, or VCSEL) if the optical cavity is bounded by a pair of horizontally-extending reflective layers.

Laser radiation can be coupled out of the tops or bottoms of VCSELs without the need for structures, such as 45° mirrors, for turning optical beams. As a consequence, VCSELs are regarded as desirable for applications involving optically emissive arrays and for optical integration, where they are packed side-by-side with other components or devices and access to the side portions of the laser elements may be precluded.

As for most lasers, it is generally desirable for one of the reflectors bounding the laser cavity to have high reflectivity, approaching 100%, at the lasing frequency. The other reflector, which functions as the exit mirror, desirably has a reflectivity that is less than 100%, but still relatively high. For example, the reflectivity of the exit mirror typically lies in the range 95%-99.9%. One useful method for forming a reflective layer structure is to grow a sequence of thin layers of alternating composition such that constructive interference occurs between reflections from the various included interfaces. This will take place if, for example, the thickness of each thin layer is at least approximately equal to one-fourth the wavelength corresponding to electromagnetic radiation of the laser frequency propagating in that layer. The resulting strong reflection (at the laser frequency) is referred to as a Bragg reflection, and a structure comprising such alternating layers is referred to as a distributed Bragg reflector (DBR).

For a given choice of layer compositions and a given laser frequency, the reflectivity of a DBR can be adjusted by appropriate selection of the number of layers. Thus a DBR having a relatively large number of layers can be used for the mirror of greater reflectivity, and a DBR having a smaller number of layers can be used for the mirror of lesser reflectivity. Moreover, a DBR can be used to enhance the reflectivity of a metallized reflective surface. Thus, for example, the mirror of greater reflectivity may comprise a metal layer and a DBR contiguous to the metal layer. In such a reflective structure, referred to as a hybrid metal DBR reflector (or, simply, a hybrid DBR), a relatively small number of semiconductor layers may suffice to provide reflectivity near 100%.

Significantly, because the active layer of a VCSEL is short, the gain in the laser cavity is generally limited by the reflectivity of the reflective structures. (This point is discussed, for example, in J. Faist, et al., "Characterization of GaAs/(GaAs)$_n$(AlAs)$_m$ surface-emitting laser structures through reflectivity and high-resolution electron microscopy measurements," *J. Appl. Phys.* 66(1989) pp. 1023-1032.) Thus, in order to assure desirable levels of laser performance (e.g., relatively low values of the threshold current), it is important to provide reflective structures of high reflectivity. In particular, it is generally desirable to provide layers in the Bragg structure that are of high quality, i.e., that are substantially planar and of substantially uniform thickness, and that form sharp interfaces with neighboring layers. Roughness of the layers, i.e., spatial variations in thickness or spatially varying deviations from planarity, is capable of scattering laser radiation and thus decreasing the reflectivity.

As is evident from the foregoing discussion, DBRs are desirable as reflective structures because the reflectivity of such structures is readily adjusted by appropriate design. DBRs are also desirable because they can be designed to offer relatively low series resistivity to the flow of electric current through the laser. A VCSEL incorporating a DBR structure and a hybrid metal DBR reflector is described, for example, in K. Tai, et al., "Room-temperature continuous-wave vertical cavity surface-emitting GaAs injection lasers," *Appl. Phys. Lett.* 55 (1989) pp. 2473-2475, which is hereby incorporated by reference.

Although relatively high reflectivity is readily achieved in a hybrid DBR using relatively few, e.g., less than ten, semiconductor layers, a greater number of layers is generally required to achieve similarly high reflectivity in a semiconductor DBR. Thus, for example, Tai, et al. report the use of 22 layer pairs in a DBR for a VCSEL. However, spatial instabilities have been observed in at least some cases when a thin layer of a III-V material has been grown on a substrate of a different III-V material. Such instabilities are capable of causing roughness in a DBR, and such roughness may even propagate and grow in severity in subsequent layers as they are added to the DBR. For example, FIG. 6 is a transmission electron micrograph of a DBR structure in which such roughness is clearly apparent after the fifth layer pair, corresponding, typically, to about 670 nm of total growth in the DBR. As is apparent from the figure, this instability has a wave-like, or zig-zag, appearance, when the DBR structure is viewed in cross section. Moreover, it is apparent that the "waves" grow in amplitude as succeeding layers are added. One undesirable result of this instability is to limit the reflectivity achievable in DBR structures. As a consequence of relatively low DBR reflectivity, the threshold current achievable in a VSCEL incorporating such a DBR may be limited to a relatively high, and therefore undesirable, value.

The zig-zag instability described above is not the only instability plaguing the growth of epitaxial III-V layers. Thus, for example, R. K. Tsui, et al., "Effects of substrate misorientation on the properties of (Al, Ga)As grown by molecular beam epitaxy," *J. Appl. Phys.* 58 (1985) pp. 2570-2572 (Tsui I), reports that a rough surface morphology can appear in (Al, Ga)As epitaxial layers grown by MBE, under certain conditions, on GaAs substrates, and that the roughness can degrade a subsequently grown GaAs layer. The authors observe that the roughness is substantially eliminated by intentionally misorienting the substrate by a small tilt angle. Later, it was reported in R. K. Tsui, et al., "Properties of $Al_xGa_{1-x}As$ ($x_{Al}$ approximately 0.3) grown by molecular-beam epitaxy on misoriented substrates," *J. Appl. Phys.* 59, (1986) pp. 1508-1512 (Tsui II), that for growth of $Al_xGa_{1-x}As$ (x approximately equal to 0.3) on a (near) (100) surface of the GaAs substrate at substrate temperatures of 620° C. and 650° C., the optimum tilt angle was 3°-5°, directed toward a nearest (111)A (gallium) surface. The authors also reported that reducing the growth temperature tended to increase the tilt angle required to grow smooth layers. Similarly, H. Z. Chen, et al., "Effect of substrate tilting on molecular beam epitaxial grown AlGaAs/GaAs lasers having very low threshold current densities," *Appl. Phys. Lett.* 51 (1987) pp. 2094-2096, reported that the morphology of structures grown on GaAs substrates, and consisting of GaAs quantum wells sandwiched between AlGaAs layers, was improved when the substrates were tilted from (100) by 4° toward a nearest (111)A surface.

Thus, various authors have demonstrated that by appropriately tilting the substrate, it is possible to reduce or eliminate one particular growth instability that causes roughness in GaAs-AlGaAs heteroepitaxial structures. Relatively high substrate temperatures have also been found to improve the layer morphology. In the case of layers grown by molecular beam epitaxy, tilting of the substrate was successful in smoothing the layers when the substrate temperature was greater than 600° C.

However, it is significant that the particular instability involved is one that appears in the very first "inverted interface;" i.e., the very first interface between an underlying GaAs surface and an AlGaAs layer grown on the surface. As described, for example, in H. Z. Chen, et al., the tilting method has been successfully applied for mitigating that particular instability and, as a result, for growing improved laser structures of a type that involve no more than about four heteroepitaxial layers. This situation is quite different from that of DBRs intended for incorporation in VCSELs. As noted, relatively many layers, typically more than ten, are required to provide adequate reflectivity of a DBR for bounding the optical cavity of a VCSEL. Unlike the "inverted interface" instability described by Tsui I, Tsui II, and Chen, cited above, the zig-zag instability does not appear in the first layer, but rather in subsequent layers, and it may even increase in severity as layers are added. In fact, the zig-zag instability can appear even under growth conditions such that the first inverted interface is smooth, and it can appear under growth conditions such that the roughness of each relevant aluminum-rich layer is smoothed by an immediately succeeding gallium-rich layer. Thus, the zig-zag instability occurs under circumstances quite different from those described, e.g., by Tsui I, Tsui II, and Chen, and as a consequence, those publications offer no guidance as to how it might be eliminated.

Zig-zag roughness in many-layered DBR structures has, in fact, been reported by J. Faist, et al., "Characterization of $GaAs/(GaAs)_n(AlAs)_m$ surface-emitting laser structures through reflectivity and high-resolution electron microscopy measurements," *J. Appl. Phys.* 66 (1989) pp. 1023-1032. In that work, growth, at a substrate temperature of 680° C., of quarter-wavelength layers of AlAs was alternated with growth of quarter-wavelength layers of $(GaAs)_9(AlAs)_2$ superlattice. The roughness was mitigated by inserting six GaAs wells in each AlAs layer, each well having a width of about 2.5 Å. However, this technique may offer some disadvantages because, inter alia, a lower substrate temperature during DBR growth is desirable, as discussed below, and also because the Faist technique necessitates the use of relatively many shutters in the MBE reactor, complicating the equipment and the procedure.

As noted, certain problems are posed by the substrate temperature. That is, when gallium-containing layers are grown by epitaxial growth methods such as MBE and MOCVD, it has been observed that the gallium sticking coefficient decreases as the temperature is increased. As a consequence, the mole fraction of gallium in the resulting layers is difficult to control, particularly at temperatures substantially greater than about 630° C. As a consequence, it is desirable to reduce the substrate temperature even further, for example to less than 600° C. while preserving desirable, i.e., smooth, layer morphology.

Thus, practitioners in the field have long sought a satisfactory method for growing VCSELs that comprise DBR structures that not only incorporate ten or more layers of alternating composition, but are also substantially free of roughness. Practitioners have hitherto been unsuccessful in finding such a method that does not involve the use of extra shutters for, e.g., intercalating included GaAs monolayers within aluminum-rich layers, and they have hitherto been unsuccessful in finding such a method that can be practiced at substrate temperatures, during DBR growth, of less than about 600° C.

SUMMARY OF THE INVENTION

It has been discovered that when the conventional (100) growth surface of a GaAs substrate is replaced by a surface that is tilted by, e.g., about 4° from (100) toward a nearest (111)A surface, DBRs of ten or more layers can be grown substantially without roughness. It has further been discovered that smooth DBR layers are readily grown even on substrates heated to less than about 600° C.

Thus, in a general sense, the invention involves a method for manufacturing a vertical cavity, surface-emitting laser (to be referred to as a VCSEL), the method comprising the steps of providing a gallium arsenide substrate having approximately a (100) growth surface, epitaxially growing a distributed Bragg reflector (to be referred to as a DBR) on the growth surface, and performing at least one additional step toward completion of the VSCEL, characterized in that the growth surface is tilted by at least about 1°, and not more than about 7°, from the orientation of a (100) surface toward the orientation of a (111)A surface, and the DBR comprises at least ten layers of alternating composition.

In a more specific, but still general, sense, the invention involves the above-described method in which the DBR layers of alternating composition comprise, in alternation, $Al_xGa_{1-x}As$ and $Al_yGa_{1-y}As$, in which x is unequal to y.

In another more specific, but still general, sense, the invention involves the above-described method in which the substrate temperature during deposition of the alternating layers is less than about 600° C.

DETAILED DESCRIPTION OF A PREFERRED EMBODIMENT

Surface emitting lasers incorporating DBRs are well-known in the art, and are described, for example, in U.S. Pat. No. 4,660,207, issued to M. N. Svilans on Apr. 21, 1987, and U.S. Pat. No. 4,873,696, issued to Coldren, et al. on Oct. 10, 1989. The component layers of such lasers are formed by epitaxial growth, for example by molecular beam epitaxy (MBE) or by organometallic vapor-phase epitaxy (OMVPE). The use of, e.g., MBE and OMVPE for making layered semiconductor structures, for example, laser structures, is also well known. Appropriate epitaxial growth techniques are described, for example, in A. Y. Cho, "Growth of III-V Semiconductors by Molecular Beam Epitaxy and their Properties," *Thin Solid Films* 100 (1983) pp. 291–317.

Figure 1:
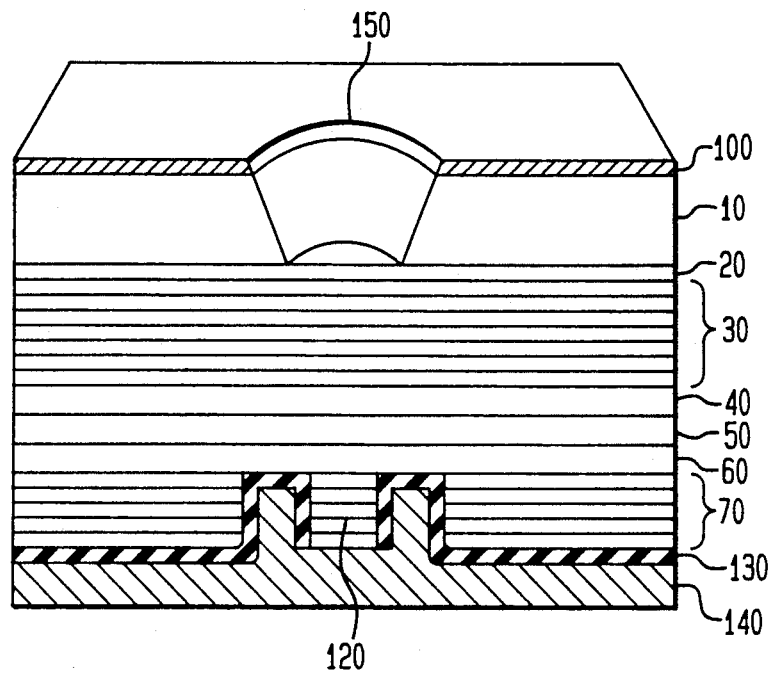
FIG. 1 is a schematic diagram of an exemplary VCSEL.
Figure 2:
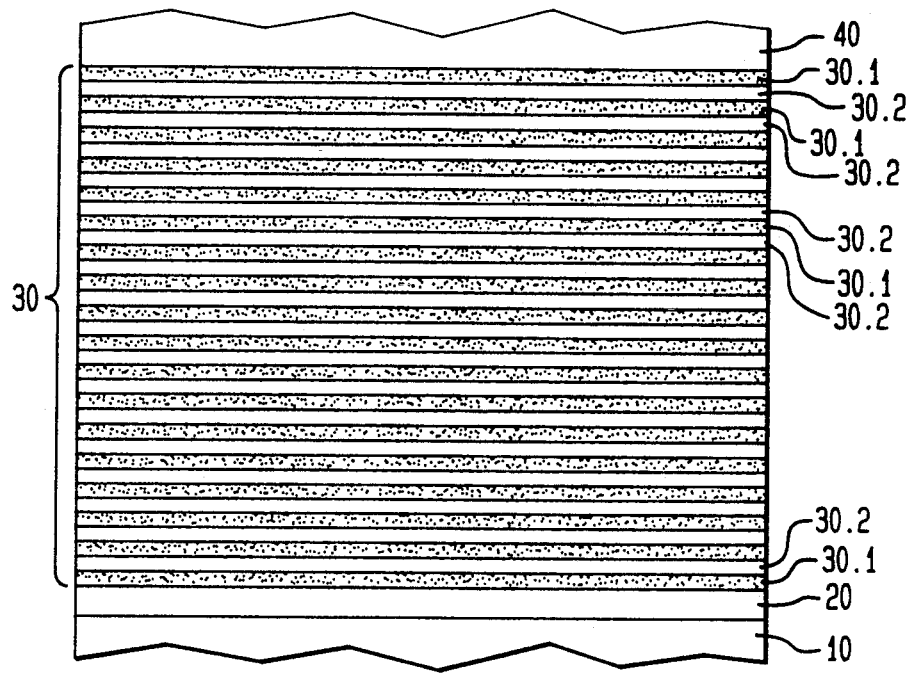
FIG. 2 is a schematic diagram showing, in detail, the n-type DBR of FIG. 1.

In a currently preferred embodiment, the inventive method involves a sequence of steps leading to the completion of a VCSEL of the design described in K. Tai, et al., cited above, and represented in FIG. 1. Briefly, beginning from Si-doped GaAs substrate 10, the following layers are sequentially grown by MBE: n-type $Al_{0.3}Ga_{0.7}As$ etch stop layer 20, n-type 22-pair quarter-wave semiconductor DBR mirror 30, which comprises, in alternation, layers 30.1 of AlAs and layers 30.2 of $Al_{0.1}Ga_{0.9}As$ (DBR 30 is shown in detail in FIG. 2), n-type $Al_{0.3}Ga_{0.7}As$ confinement layer 40, p-type GaAs active region 50, p-type $Al_{0.3}Ga_{0.7}As$ confinement layer 60, p-type 5-pair quarter-wave semiconductor DBR 70, which comprises, in alternation, layers 70.1 of $Al_{0.1}Ga_{0.9}As$ and layers 70.2 of $Al_{0.7}Ga_{0.3}As$ (DBR 70 is shown in detail in FIG. 3), $Al_{0.7}Ga_{0.3}As$ phase matching layer 80 (shown in FIG. 3), and heavily p-doped GaAs contact layer 90 (shown in FIG. 3).

Figure 4:
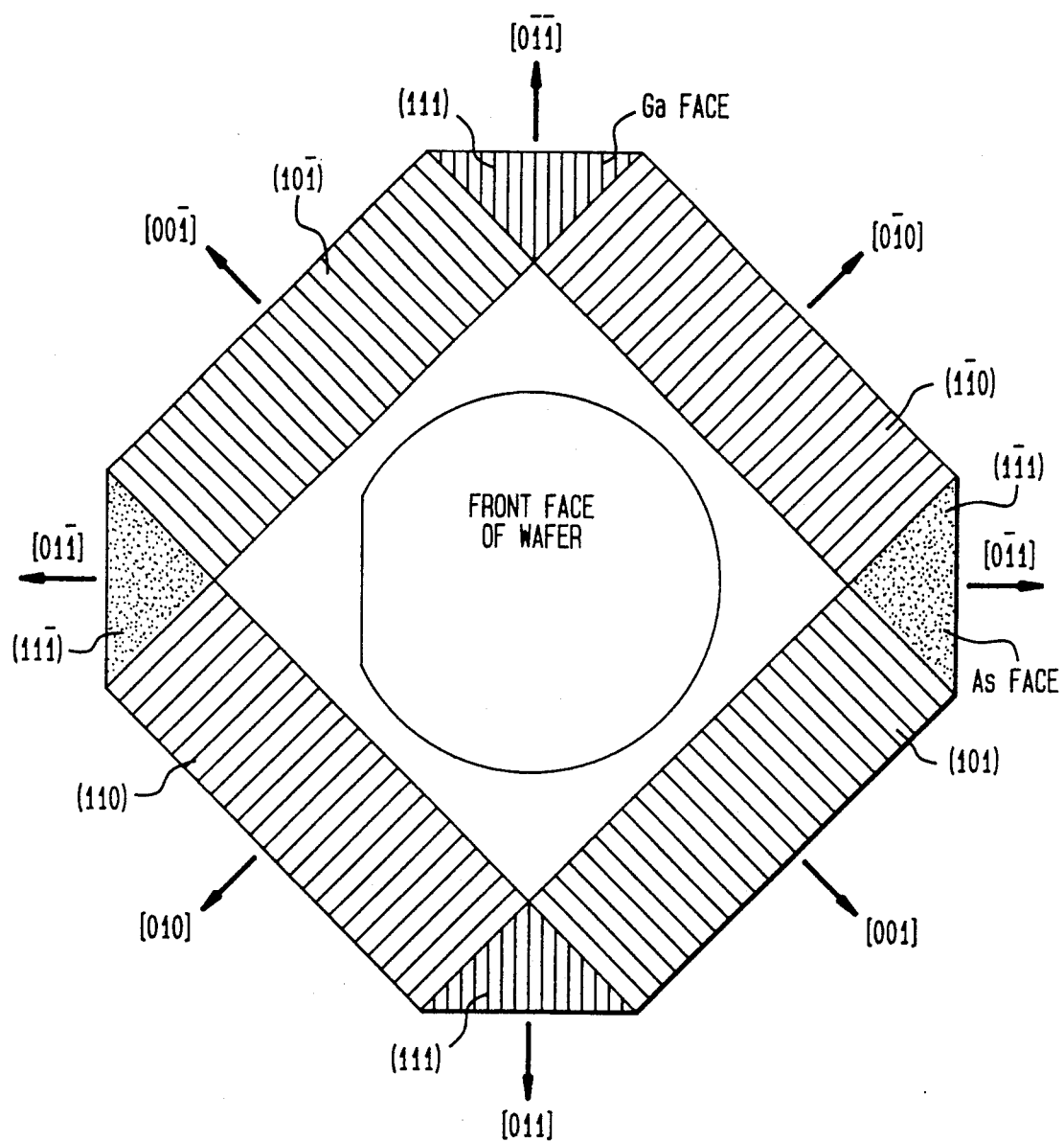
FIG. 4 is a schematic diagram illustrating, inter alia, the crystallographic orientations of (100) and (111) surfaces.

When conventional methods of manufacture are used (as disclosed, for example, in K. Tai, et al., cited above), the successive layers are grown on a (100)-oriented substrate. Significantly, an improved morphology at least of DBR 30, and improved laser performance (e.g., reduced threshold current) are obtained when the substrate growth surface is deliberately misaligned in a prescribed manner relative to the (100) direction. That is, contrary to conventional methods of VCSEL fabrication, the growth surface should be tilted from the (100) direction toward the (111)A direction by an angle that is at least about 1° and not more than about 7°, and that is preferably about 4°. A substrate with an appropriately tilted growth surface is readily prepared by conventional techniques. The crystallographic orientations of a (100) face and (111) faces are illustrated schematically in FIG. 4.

As noted, the DBRs consist of alternating layers of $Al_xGa_{1-x}As$ and $Al_yGa_{1-y}As$, with, for the n-type DBR, $x=1$ and $y=0.1$, and for the p-type DBR, $x=0.1$ and $y=0.7$. Other values for x and y, subject to the requirement that each layer be about one-quarter wavelength thick relative to the laser wavelength in the material of that layer, will be readily apparent to the skilled practitioner. It is significant that DBR structures characterized by values of x or y greater than 0.35 are readily made by the methods herein described.

Figure 3:
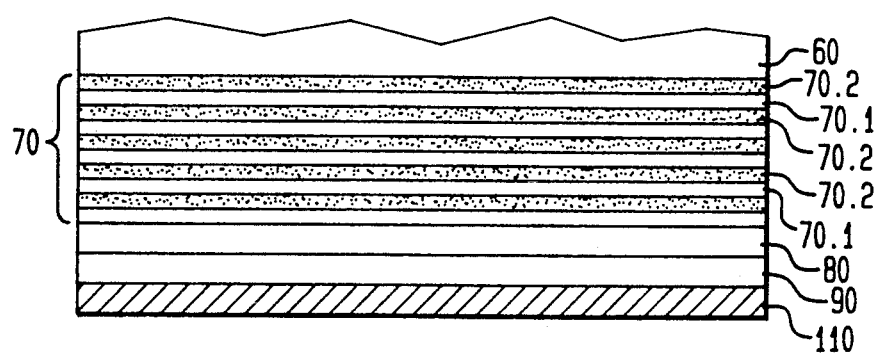
FIG. 3 is a schematic diagram showing, in detail, the p-type DBR of FIG. 1.

After the enumerated layers are grown, the combined thickness of the substrate and layer structure is reduced, exemplarily by lapping, to 100 μm in order to reduce thermal problems and permit optical output. An alloyed contact 100, consisting of germanium (400 Å) and gold (1200 Å) is then deposited, exemplarily by evaporation, on the back of the substrate. As shown in FIG. 3, contacts 110, 15 μm in diameter and consisting of silver (1000 Å) and gold (1000 Å) are then deposited on contact layer 90 by the photoresist lift-off technique. Turning again to FIG. 1, ring mesas 120, which are exemplarily of 15 μm i.d. and 60 μm o.d., are then wet etched in the top surface (i.e., the surface opposite to the substrate) in $H_2SO_4:H_2O_2:H_2O$ down to the top of confinement layer 60. For current isolation, a silicon dioxide layer 130, exemplarily 1500 Å in thickness, is then deposited, exemplarily by CVD, on the top surface. Gold contact pads 140 are then deposited, e.g., evaporatively deposited, on silicon dioxide layer 130. Holes 150 are then formed in the substrate, for optical transmission, by wet etching down to the bottom (i.e., the side proximate the substrate) of DBR 30. A useful etchant for this purpose is $H_2O_2:NH_4OH$. The substrate is then diced to form at least one individual laser element.

An exemplary thickness for confinement layers 40 and 60 is 0.15 μm, and for active layer 50 is 0.5 μm. Phase matching layer 80 is exemplarily 450 Å thick. (The purpose of the phase matching layer is to enhance the constructive interference between light reflected in DBR 70 and light reflected from the silver layer of contact 110. Thus, more generally, the phase matching layer is adapted to compensate for the phase shift that occurs upon reflection from the metal-semiconductor interface.) It should be noted that DBR 70 in combination with the silver layer of contact 110 functions as a hybrid DBR.

The DBR structures are designed to have peak reflectivity at a (vacuum) wavelength of about 0.87 μm. Accordingly, the AlAs layers 30.1 of the n-type DBR 30 are 720 Å thick, and the $Al_{0.1}Ga_{0.9}As$ layers 30.2 are 618 Å thick. The n-type DBR is doped with silicon at an exemplary concentration of $5 \times 10^{17}$ cm$^{-3}$. The n-type confinement layer 40 is exemplarily doped with silicon at a concentration of $5 \times 10^{17}$ cm$^{-3}$. The active layer 50 is exemplarily doped with beryllium at a concentration of $5 \times 10^{16}$ cm$^{-3}$. The p-type confinement layer 60 is exemplarily doped with beryllium at a concentration of $5 \times 10^{18}$ cm$^{-3}$. The $Al_{0.7}Ga_{0.3}As$ layers of the p-type DBR are 700 Å thick, and the $Al_{0.1}Ga_{0.9}As$ layers are 618 Å thick. The p-type DBR is doped with beryllium at a concentration of $10^{19}$ cm$^{-3}$.

In order to enhance the quality of the active layer, a three-period superlattice (not shown) is optionally included between the n-type confinement layer and the active layer. A useful superlattice for this purpose includes three 10-Å-thick GaAs layers 160.1 in alternation with three 10-Å-thick $Al_{0.3}Ga_{0.7}As$ layers 160.2.

The temperature of the substrate during the growth of the n-type DBR is desirably at least about 500° C. However, substrate temperatures less than about 600° C. are preferred because it is easier to control the stoichiometry at the lower temperatures. Thus, for example, the DBR is readily grown at 580° C., and even at temperatures as low as about 560° C. Exemplary substrate temperatures for the growth of succeeding layers are: for the n-type confinement layer, 680° C., for the active layer, 570° C., for the p-type confinement layer, 585° C., and for the p-type DBR, 550° C.

Exemplary growth rates for the various layers of the VCSEL structure, enumerated according to composition, are: for $Al_{0.3}Ga_{0.7}As$ layers 20, 40, and 60, 1.8 μm/hour; for $Al_{0.1}Ga_{0.9}As$ layers 30.2 and 70.1, 2.16 μm/hour; for AlAs layers 30.1, 0.216 μm/hour; for $Al_{0.7}Ga_{0.3}As$ layers 70.2 and 80, 0.31 μm/hour; and for GaAs layers 50 and 90, 1.2 μm/hour.

Significantly, it is preferable to grow the p-type DBR under special conditions in order to provide the relatively high doping level that is preferred (i.e., beryllium at a concentration of $10^{19}$ cm$^{-3}$). Such conditions are provided by reducing the substrate temperature, exemplarily to 550° C. (as noted, above), and also by adjusting the MBE system to provide an increased $As_4/III$ ratio. The effect of such conditions on beryllium incorporation is discussed in Y. C. Pao and J. Franklin, "Influence of $As_4$/Ga Flux Ratio on Be Incorporation in Heavily Doped GaAs Grown by Molecular Beam Epitaxy," *J. Crystal Growth* 95 (1989) 301–304, which is hereby incorporated by reference.

EXAMPLE I

A group of VCSELs was made according to the methods and the general design described above. The various layers of the VCSEL were grown by MBE on a GaAs substrate having its growth surface misaligned by 4° from the (100) direction toward the (111)A direction. (A control group of VCSELs were also grown, on a (100) substrate.) Grown in sequence on the substrate were a 17.5-pair n-type DBR, an n-type 0.13-μm-thick confinement layer, a three-period superlattice, a p-type 0.47-μm-thick GaAs active layer, a p-type 0.13-μm-thick confinement layer, and a 5-pair p-type hybrid DBR. In both the tilted-substrate VCSELs and the control VCSELs, the n-type DBRs were grown at 580° C. The DBR structures were designed to have peak reflectivity at a wavelength of 0.87 μm.

Figure 5:
FIG. 5 is a transmission electron micrograph illustrating the morphological properties of a DBR grown according to the invention.
Figure 6:
FIG. 6 is a transmission electron micrograph illustrating the morphological properties of a DBR grown conventionally.

Shown in FIGS. 5 and 6 are cross-sectional profiles of n-type DBRs, imaged by transmission electron microscopy (TEM). Compared in the figures are a DBR 200 grown on a misaligned substrate (FIG. 5), and a DBR 210 from the control group, grown on a (100) substrate (FIG. 6). Rough interfaces are evident in the top few layers of DBR 210, whereas the entirety of DBR 200 exhibits smooth interfaces.

Both the tilted-substrate VCSELs and the control VCSELs exhibited a single, longitudinal mode lasing characteristic with a side mode suppression ratio of 40 dB and a resolution-limited linewidth of 2 Å. Due to thickness variations, the emission wavelength varied from 850 nm to 880 nm, depending on position on the undivided wafer.

In pulsed operation, the threshold current of the tilted-substrate VCSELs varied from 40 mA down to 12 mA, which is close to the theoretical value. The best tilted-substrate VCSEL tested had a threshold current of 12 mA, a threshold current density of 10.5 kA/cm$^2$ (corresponding to 21 kA/cm$^2$-μm for the 0.5-μm cavity length), and an emission efficiency of 0.2 mW/mA. The control VCSELs, by contrast, exhibited threshold currents having a larger mean value and greater variation. These currents ranged from 60 mA down to 20 mA.

The smaller threshold current values and the smaller variation of such values for the tilted-substrate VCSELs are attributed to higher effective mirror reflectivities relative to the control VCSELs, consistent with the TEM results of, e.g., FIG. 5.

This example shows that a reduction of the threshold current of 20%-50% can be achieved in a GaAs-AlGaAs VCSEL having a thick AlGaAs DBR structure when the VCSEL is grown on a substrate surface oriented 4° away from the (100) direction and toward the (111)A direction, rather than on a (100)-oriented substrate surface.

EXAMPLE II

Figure 7:
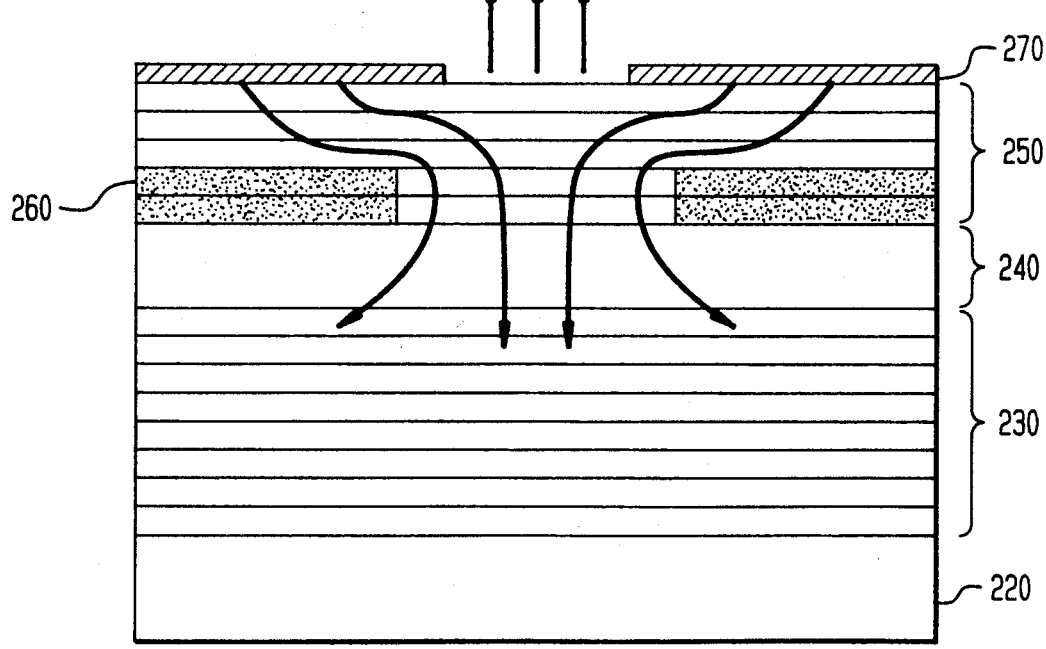
FIG. 7 is a schematic diagram of an exemplary VCSEL incorporating a quantum well structure.

In a second example, a VCSEL was made substantially as described above, but incorporating a quantum well structure instead of a double heterostructure. As depicted in FIG. 7, the quantum well laser included a 4° tilted n-GaAs substrate 220, and formed in sequence on the substrate, 28-pair n-type DBR 230, graded-refractive-index separate-confinement heterostructure (GRINSCH) 240, comprising four quantum wells, 20-pair p-type DBR 250, which includes annular current-blocking portion 260, and annular gold-beryllium alloy contact 270. The current-blocking portion was formed by implantation of hydrogen ions into the p-DBR region 250, and it encompassed about 4 or 5 layer pairs, or a total thickness of about 0.5 μm. The quantum well structure was composed of alternate layers of $Al_{0.2}Ga_{0.8}As$ (80 Å) and GaAs (100 Å). On each side of the quantum well structure was a grading layer (not shown), 2150 Å in thickness and composed of $Al_xGa_{1-x}As$, with x varying from 0.6 to 0.3. For this device in continuous operation, a 2 mA threshold current with an output power of 1 mW was obtained with a 10-μm-diameter window, giving a threshold current density of about 2.5 kA/cm$^2$.

We claim:

1. A method for manufacturing a vertical cavity, surface-emitting laser (to be referred to as a VCSEL), the method comprising the steps of providing a gallium arsenide substrate having approximately a (100) growth surface, epitaxially growing a distributed Bragg reflector (to be referred to as a DBR) on the growth surface, and performing at least one additional step toward completion of the VCSEL, CHARACTERIZED IN THAT the growth surface is tilted by at least 1°, and not more than about 7°, from the orientation of a (100) surface toward the orientation of a (111)A surface;

the DBR comprises at least ten layers of alternating composition;

the DBR layers of alternating composition comprise, in alternation, $Al_xGa_{1-x}As$ and $Al_yGa_{1-y}As$, wherein one of x and y is greater than 0.35, and the other of x and y is less than or equal to 0.35; and during the step of epitaxially growing the DBR, the substrate temperature is less than 600° C.

2. Method of claim 1, in which x is approximately equal to 1, and y is approximately equal to 0.1.

3. Method of claim 1, in which x is approximately equal to 0.1, and y is approximately equal to 0.7.

4. Method of claim 1, in which the VCSEL has a threshold current density of at most about 10.5 kA/cm$^2$.

5. Method of claim 1, in which the epitaxially growing step comprises growing the DBR by molecular beam epitaxy.

6. Method of claim 1, in which one of x and y is at least 0.7 and not more than 1.0, and the other of x and y is less than 0.7.

7. Method of claim 6, in which each layer of the DBR is grown by molecular beam epitaxy at a rate of at least 0.2 μm per hour.

* * * * *